(12) United States Patent
Tsao et al.

(10) Patent No.: US 11,069,785 B2
(45) Date of Patent: *Jul. 20, 2021

(54) SEMICONDUCTOR DEVICE AND FABRICATION METHOD THEREOF

(71) Applicant: Taiwan Semiconductor Manufacturing Company Ltd., Hsinchu (TW)

(72) Inventors: Chun-Han Tsao, New Taipei (TW); Chih-Ming Chen, Hsinchu (TW); Han-Yu Chen, Hsinchu County (TW); Szu-Yu Wang, Hsinchu (TW); Lan-Lin Chao, Taipei County (TW); Cheng-Yuan Tsai, Hsin-Chu County (TW)

(73) Assignee: Taiwan Semiconductor Manufacturing Company Ltd., Hsinchu (TW)

( * ) Notice: Subject to any disclaimer, the term of this patent is extended or adjusted under 35 U.S.C. 154(b) by 70 days.

This patent is subject to a terminal disclaimer.

(21) Appl. No.: 16/396,621

(22) Filed: Apr. 26, 2019

(65) Prior Publication Data

US 2019/0259848 A1 Aug. 22, 2019

Related U.S. Application Data

(60) Continuation of application No. 15/693,849, filed on Sep. 1, 2017, now Pat. No. 10,276,678, which is a
(Continued)

(51) Int. Cl.
*H01L 29/76* (2006.01)
*H01L 29/94* (2006.01)
(Continued)

(52) U.S. Cl.
CPC .. *H01L 29/42344* (2013.01); *H01L 21/02063* (2013.01); *H01L 21/02068* (2013.01);
(Continued)

(58) Field of Classification Search
CPC ......... H01L 21/28518; H01L 21/28052; H01L 21/32053; H01L 21/02063; H01L 21/28568
(Continued)

(56) References Cited

U.S. PATENT DOCUMENTS

| 6,507,123 B1 | 1/2003 | Woo et al. |
| 6,699,755 B1 | 3/2004 | Chiou et al. |

(Continued)

*Primary Examiner* — Theresa T Doan
(74) *Attorney, Agent, or Firm* — Haynes and Boone, LLP

(57) ABSTRACT

A semiconductor device and a fabrication method thereof are provided. The semiconductor device includes a semiconductor structure, a dielectric layer, a metal-semiconductor compound film and a cover layer. The semiconductor structure has an upper surface and a lateral surface. The dielectric layer encloses the lateral surface of the semiconductor structure and exposes the upper surface of the semiconductor structure. The metal-semiconductor compound film is on the semiconductor structure, wherein the dielectric layer exposes a portion of a surface of the metal-semiconductor compound film. The cover layer encloses the portion of the surface of the metal-semiconductor compound film exposed by the dielectric layer, and exposes the dielectric layer.

20 Claims, 23 Drawing Sheets

Related U.S. Application Data division of application No. 15/142,775, filed on Apr. 29, 2016, now Pat. No. 9,754,827.

(51) Int. Cl.

| | | |
|---|---|---|
| *H01L 29/423* | (2006.01) | |
| *H01L 29/66* | (2006.01) | |
| *H01L 21/28* | (2006.01) | |
| *H01L 21/285* | (2006.01) | |
| *H01L 21/768* | (2006.01) | |
| *H01L 27/11568* | (2017.01) | |
| *H01L 27/11573* | (2017.01) | |
| *H01L 49/02* | (2006.01) | |
| *H01L 21/02* | (2006.01) | |

(52) U.S. Cl.
CPC .. *H01L 21/28052* (2013.01); *H01L 21/28518* (2013.01); *H01L 21/76834* (2013.01); *H01L 21/76856* (2013.01); *H01L 27/11568* (2013.01); *H01L 27/11573* (2013.01); *H01L 28/00* (2013.01); *H01L 29/665* (2013.01)

(58) Field of Classification Search
USPC .......................................................... 257/384
See application file for complete search history.

(56) References Cited

U.S. PATENT DOCUMENTS

| | | | |
|---|---|---|---|
| 7,064,379 B2 | 6/2006 | Kutsukake et al. | |
| 7,226,834 B2 * | 6/2007 | Bu | H01L 21/76828 |
| | | | 257/E21.438 |
| 9,214,396 B1 * | 12/2015 | Flachowsky | H01L 21/76879 |
| 9,754,827 B1 * | 9/2017 | Tsao | H01L 27/11573 |
| 2003/0087513 A1 | 5/2003 | Noguchi et al. | |
| 2003/0122179 A1 * | 7/2003 | Matsuki | H01L 21/76834 |
| | | | 257/314 |
| 2005/0023597 A1 * | 2/2005 | Kutsukake | H01L 27/11519 |
| | | | 257/315 |
| 2005/0233514 A1 | 10/2005 | Bo et al. | |
| 2017/0287777 A1 * | 10/2017 | Patil | H01L 21/76859 |

* cited by examiner

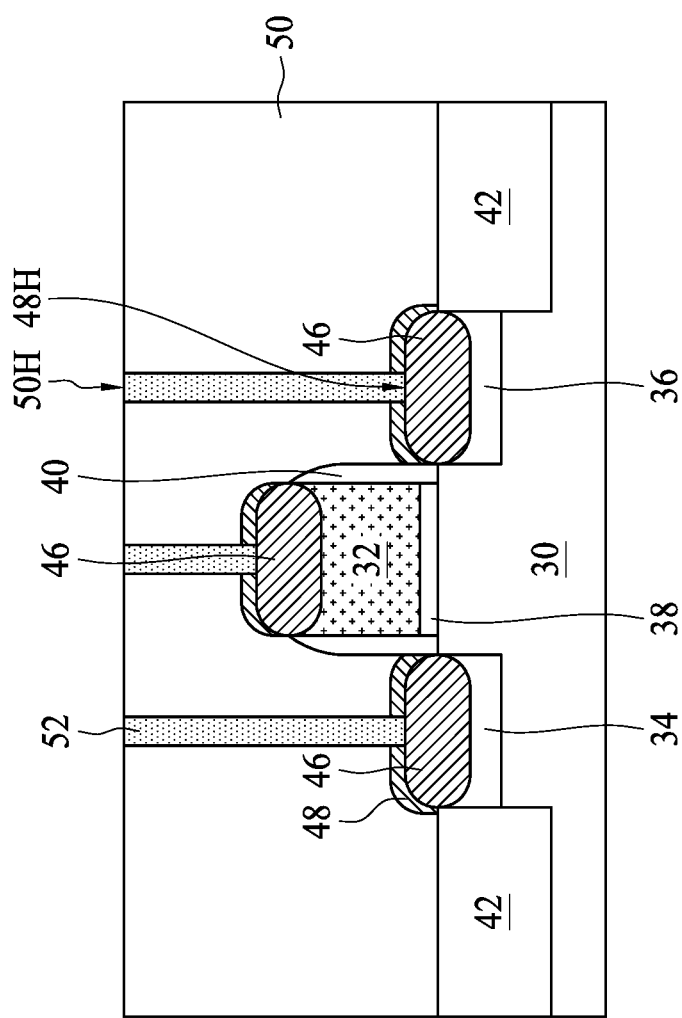

SEMICONDUCTOR DEVICE AND FABRICATION METHOD THEREOF

PRIORITY DATA

The present application is a Continuation Application of U.S. patent application Ser. No. 15/693,849, filed Sep. 1, 2017, which is a Divisional Application of U.S. patent application Ser. No. 15/142,775, filed Apr. 29, 2016, now U.S. Pat. No. 9,754,827, entitled "SEMICONDUCTOR DEVICE AND FABRICATION METHOD THEREOF", each of which is hereby incorporated by reference in its entirety.

BACKGROUND

In semiconductor fabrications, silicidation is used to form low resistivity contacts between semiconductor structure such as polycrystalline gate electrodes or source/drain region and metal contact. However, metal residues are found after silicidation operation, and the metal residues would severely affect electrical characteristics of semiconductor device, particularly in advanced semiconductor fabrication.

BRIEF DESCRIPTION OF THE DRAWINGS

Aspects of the present disclosure are best understood from the following detailed description when read with the accompanying figures. It is noted that, in accordance with the standard practice in the industry, various structures are not drawn to scale. In fact, the dimensions of the various structures may be arbitrarily increased or reduced for clarity of discussion.

FIGS. 4A, 4B, 4C, 4D, 4E, 4F, 4G and 4H are cross-sectional views at one of various operations of manufacturing a semiconductor device according to some embodiments of the present disclosure.

DETAILED DESCRIPTION

Figure 1:
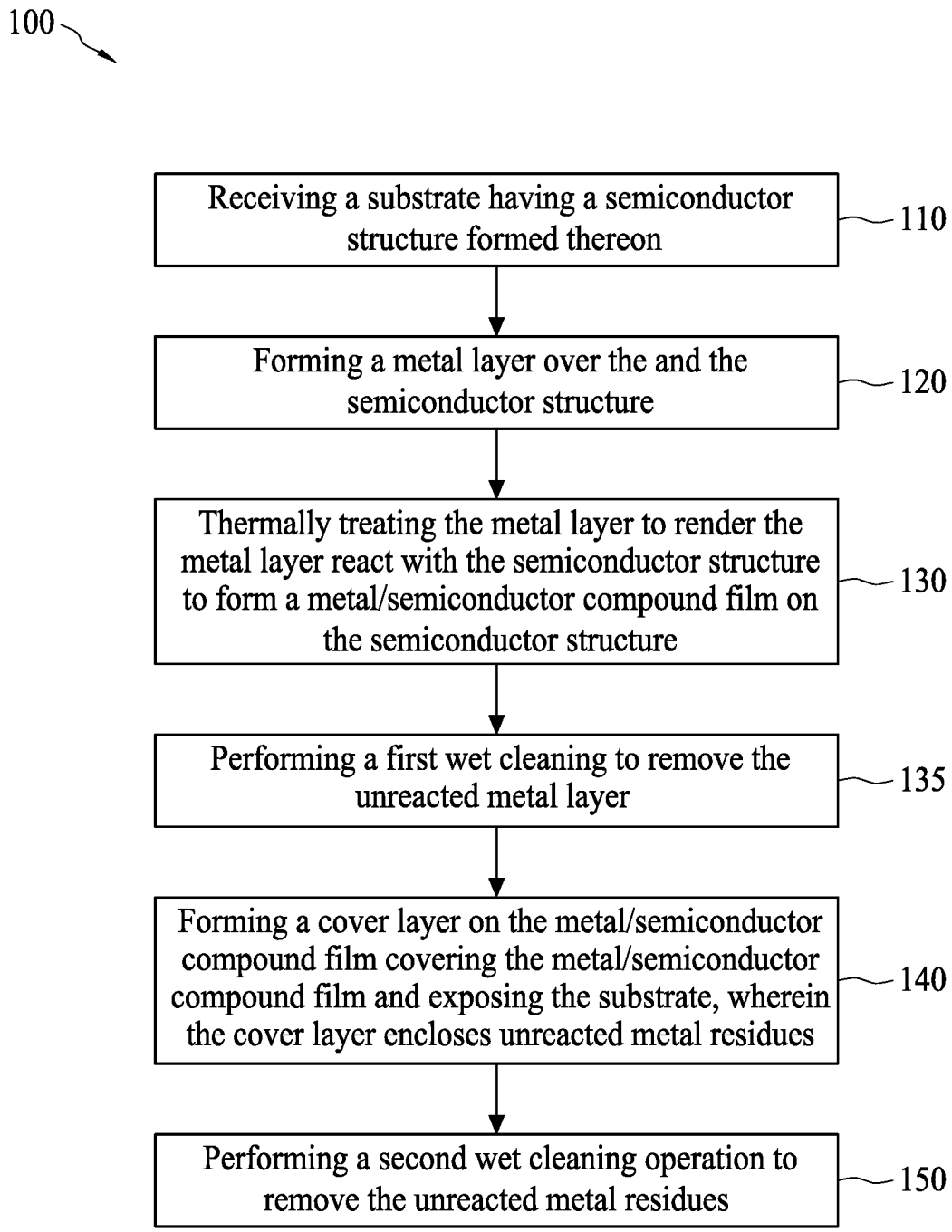
FIG. 1 is a flow chart illustrating a method for fabricating semiconductor device according to various aspects of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above", "upper", "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as "first", "second" and "third" describe various elements, components, regions, layers and/or sections, these elements, components, regions, layers and/or sections should not be limited by these terms. These terms may be only used to distinguish one element, component, region, layer or section from another. The terms such as "first", "second", and "third" when used herein do not imply a sequence or order unless clearly indicated by the context.

As used herein, the term "semiconductor structure" refers to a structure formed of semiconductor material(s). The semiconductor material may comprise elementary semiconductor such as silicon or germanium; a compound semiconductor such as silicon germanium, silicon carbide, gallium arsenic, gallium phosphide, indium phosphide or indium arsenide; or combinations thereof. The semiconductor structure may comprise a gate electrode, a source region, a drain region, or any other nodes or terminals of semiconductor devices such as MOS device, logic device, memory device or other semiconductor devices. The semiconductor material may be doped or undoped semiconductor material. The semiconductor may comprise polycrystalline semiconductor such as polycrystalline silicon, amorphous semiconductor such as amorphous silicon, epitaxial semiconductor such as epitaxial silicon, or other semiconductor material having other crystalline states.

As used herein, the term "metal-semiconductor compound" refers to a compound or an alloy formed of metal material(s) and semiconductor material(s). The metal material(s) may comprise transition metal such as nickel, platinum, cobalt, tungsten, combinations thereof, or other suitable metals. The semiconductor material(s) may comprise elementary semiconductor such as silicon or germanium; a compound semiconductor such as silicon germanium, silicon carbide, gallium arsenic, gallium phosphide, indium phosphide or indium arsenide; or combinations thereof. In some embodiments, the metal-semiconductor compound comprises metal silicide such as nickel silicide, platinum silicide, nickel platinum silicide or other suitable metal silicides. In some embodiments, the metal-semiconductor compound comprises metal comprises metal germanide.

In the present disclosure, a cover layer is selectively formed to cover the metal-semiconductor compound film. The cover layer also encloses unreacted metal residues after formation of the metal-semiconductor compound film. The metal residue enclosed by the cover layer is easier to be removed in a wet cleaning treatment compared to the metal residue not enclosed by the cover layer. Reduction of metal residues alleviates various electrical issues such as reduction of time-dependent dielectric breakdown (TDDB) and breakdown voltage ($V_{BD}$).

FIG. 1 is a flow chart illustrating a method for fabricating semiconductor device according to various aspects of the present disclosure. The method 100 begins with operation 110 in which a substrate having a semiconductor structure formed thereon is received. The method 100 continues with operation 120 in which a metal layer comprising a first metal and a second metal is formed over the substrate and the semiconductor structure. The method 100 proceeds with operation 130 in which the metal layer is thermally treated to render the metal layer react with the semiconductor structure to form a metal-semiconductor compound film on the semiconductor structure. The method 100 proceeds with operation 135 in which a first wet cleaning operation is performed to preliminarily remove the unreacted metal layer. The method 100 continues with operation 140 in which a cover layer is formed covering the metal-semiconductor compound film and exposing the substrate, wherein the cover layer encloses unreacted metal residues. The method 100 continues with operation 150 in which a wet cleaning operation is performed to remove the unreacted metal residues.

The method 100 is merely an example, and is not intended to limit the present disclosure beyond what is explicitly recited in the claims. Additional operations can be provided before, during, and after the method 100, and some operations described can be replaced, eliminated, or moved around for additional embodiments of the method.

Figure 2A:
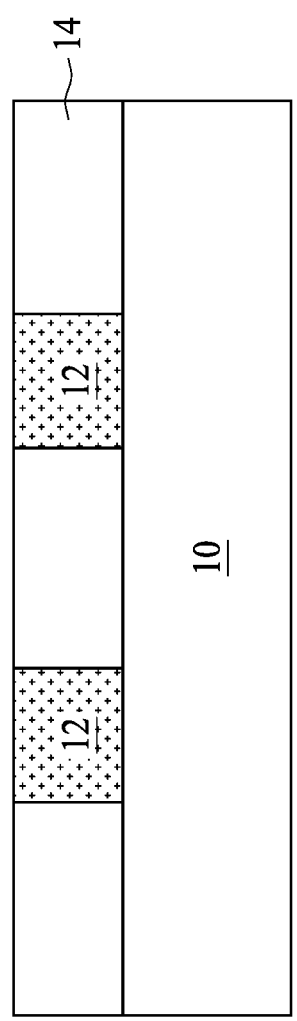
FIGS. 2A, 2B, 2C, 2D, 2E and 2F are cross-sectional views at one of various operations of manufacturing a semiconductor device according to some embodiments of the present disclosure.

FIGS. 2A, 2B, 2C, 2D, 2E and 2F are cross-sectional views at one of various operations of manufacturing a semiconductor device according to some embodiments of the present disclosure. As depicted in FIG. 2A and operation 110 in FIG. 1, a substrate 10 having semiconductor structures 12 formed thereon is received. In some embodiments, the substrate 10 is a semiconductor substrate. The material of the semiconductor substrate 12 may comprise elementary semiconductor such as silicon or germanium; a compound semiconductor such as silicon germanium, silicon carbide, gallium arsenic, gallium phosphide, indium phosphide or indium arsenide; or combinations thereof. The semiconductor structure 12 is formed of semiconductor material. In some embodiments, the semiconductor structure 12 is formed of doped semiconductor material such as doped polycrystalline silicon. The semiconductor structure 12 may also be formed of other doped or undoped semiconductor material. For example, the semiconductor structure 12 may comprise elementary semiconductor such as silicon or germanium; a compound semiconductor such as silicon germanium, silicon carbide, gallium arsenic, gallium phosphide, indium phosphide or indium arsenide; or combinations thereof. In some embodiments, the semiconductor structure 12 is configured as an electrode or a node of a semiconductor device such as a gate electrode or a source/drain region.

In some embodiments, a dielectric layer 14 is formed, at least partially enclosing the lateral surface of the semiconductor structure 12. The upper surface of the semiconductor structure 12 is exposed by the dielectric layer 14. The dielectric layer 14 may be formed of oxide, nitride, oxynitride, or any other suitable inorganic or organic materials.

Figure 2B:
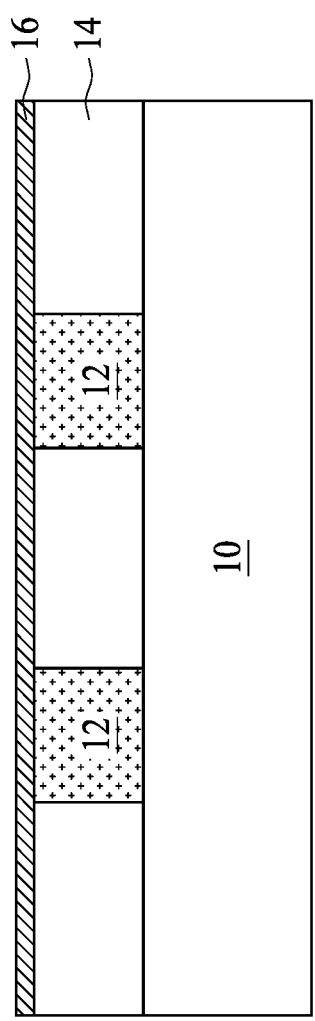

As depicted in FIG. 2B and operation 120 in FIG. 1, a metal layer 16 is formed over the substrate 10 and the semiconductor structure 12. In some embodiments, the metal layer 16 is formed over the dielectric layer 14 and in contact with the upper surface of the semiconductor structure 12. In some embodiments, the metal layer 16 is an alloy layer formed of a plurality of metal materials. The metal materials may include two or more transition metal materials such as nickel (Ni), platinum (Pt), cobalt (Co), tungsten (W), titanium (Ti), combinations thereof, or other suitable metal materials. In some alternative embodiments, the metal layer 16 is a metallic layer of a single metal material. The metal material may include a transition metal material such as nickel (Ni), platinum (Pt), cobalt (Co), tungsten (W), titanium (Ti), or other suitable metal materials.

In some exemplary embodiments, the metal layer 16 is a nickel-platinum alloy, or a nickel layer with platinum dopants, where the amount ratio of nickel to platinum may be adjusted based on different considerations. The semiconductor structure 12 is polycrystalline silicon. In some embodiments, the metal layer 16 is formed by physical vapor deposition (PVD) such as sputtering, but not limited thereto. In the present embodiments, nickel is configured to form nickel semiconductor compound, e.g., nickel silicide. Platinum may be configured as a stabilizer for nickel silicide. In some embodiments, nickel layer with platinum dopants is formed by physical vapor deposition (PVD) such as sputtering using nickel-platinum target. In some alternative embodiments, the metal layer 16 may be formed by other suitable deposition operations.

Figure 2C:
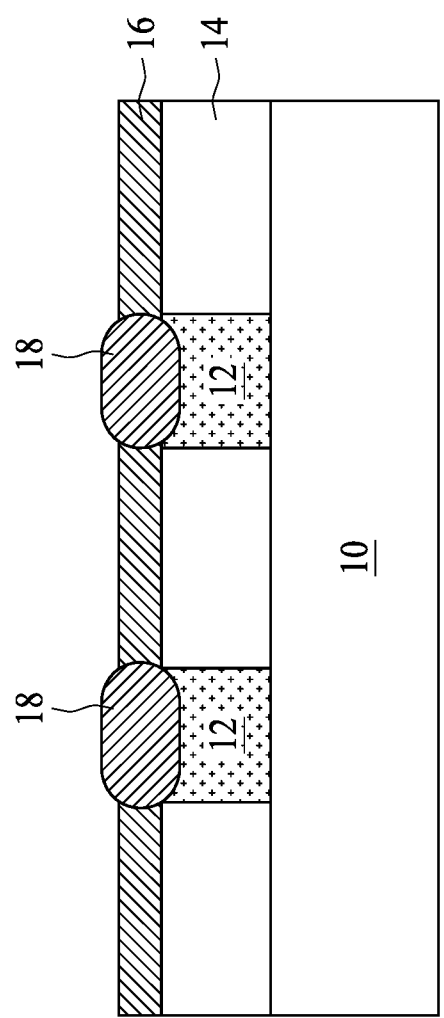

As depicted in FIG. 2C and operation 130 in FIG. 1, the metal layer 16 is thermally treated to render nickel react with the semiconductor structures 12 to form metal-semiconductor compound films (nickel silicide) 18 on the semiconductor structures respectively. During the thermal treatment, a portion of nickel elements in the metal layer 16 in contact with the semiconductor structures 12 are reacted, thereby selectively and locally forming nickel silicide on the upper surface of the semiconductor structures 12, respectively. On the other hands, the rest portion of the metal layer 16 that is not in contact with the semiconductor structures 12 is not reacted. In some embodiments, a rapid thermal annealing (RTA) may be performed to thermally treat the metal layer 16. Compared to the semiconductor structure (polycrystalline silicon) 12, the metal-semiconductor compound film (nickel silicide) 18 has lower resistivity, and thus the overall electrical characteristic is enhanced.

Figure 2D:
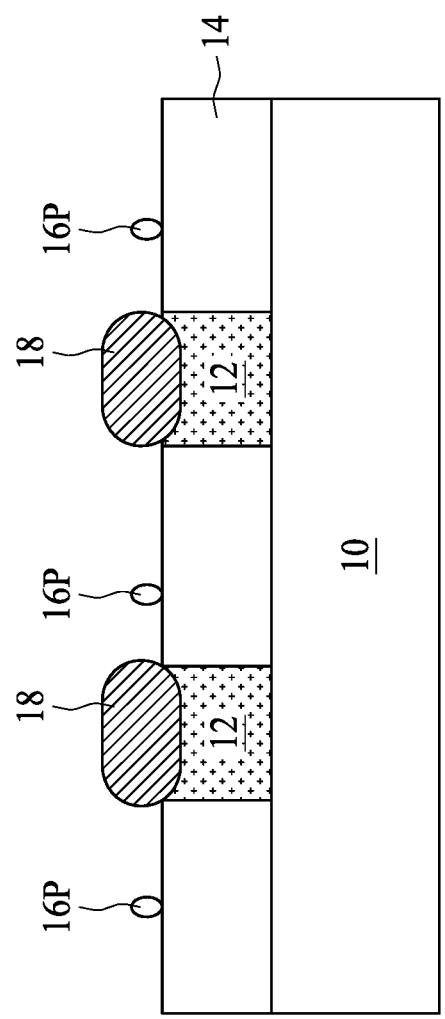

As depicted in FIG. 2D and operation 135 in FIG. 1, the unreacted metal layer 16 is then removed from the dielectric layer 14. The dielectric layer 14 exposes a portion e.g., upper portion, of a surface of the metal-semiconductor compound film 18. In some embodiments, the unreacted metal layer 16 is stripped by a cleaning solution e.g., sulfuric acid-hydrogen peroxide mixture (SPM) solution, but not limited thereto. In some embodiments, the removal of the unreacted portion of the metal layer 16 is a first wet clean operation. It is appreciated that unreacted metal residues 16P including nickel residues and platinum residues may exist on the dielectric layer 14 after the metal layer 16 is removed, which deteriorates electrical characteristics and lead to device breakdown problems. For example, the unreacted metal residues 16P, particularly platinum residues, may induce worse time dependent dielectric breakdown (TDDB) and reduce breakdown voltage ($V_{BD}$).

Figure 2E:
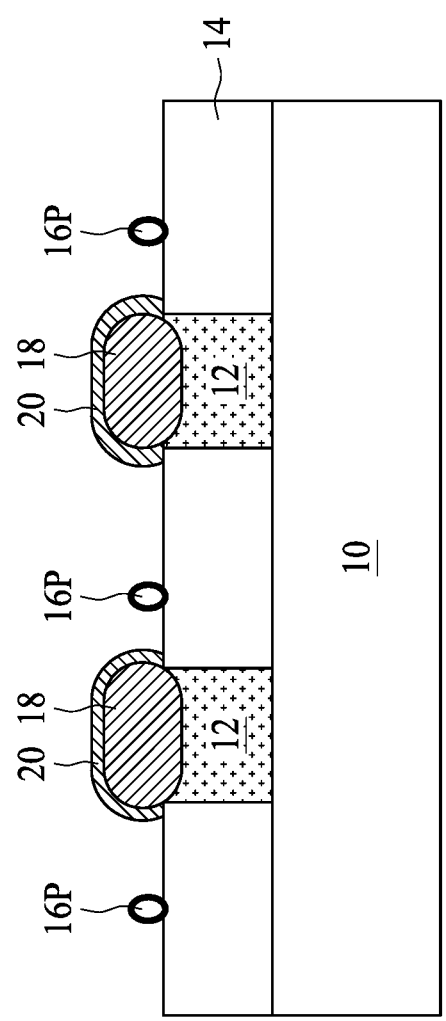

As depicted in FIG. 2E and operation 140 in FIG. 1, a cover layer 20 is formed on the metal-semiconductor compound films 18, and encloses the portion of the surface of the metal-semiconductor compound films 18 exposed by the dielectric layer 14. In some embodiments, the cover layer 20 is an insulator. The cover layer 20 also encloses the unreacted metal residues 16P. The cover layer 20 exposes the rest structures other than the metal-semiconductor compound films 18 such as the dielectric layer 14. In some embodiments, the cover layer 20 is selectively and locally formed on the metal-semiconductor compound films 18, and thus the cover layer 20 is in contact with the exposed portion of the surface of the metal-semiconductor compound films 18 and encloses the unreacted metal residues 16P, but exposes the dielectric layer 14. In some embodiments, the cover layer 20 is substantially conformal to the exposed portion of the surface of the metal-semiconductor compound films 18. The thickness of the cover layer 20 may be modified so that it can enclose the unreacted metal residue 16P. In some embodiments, the thickness of the cover layer 20 is within a range of 2-30 mm, but not limited thereto. For example, the thickness of the cover layer 20 is within a range of 2-5 mm, a range of 6-10 mm, a range of 11-15 mm, a range of 16-20 mm, or a range of 21-33 mm, In some embodiments, the cover layer 20 is selectively and locally formed on the metal-semiconductor compound films 18 by a gaseous treatment. For example, a gas flow is introduced in reaction chamber, and the gas molecules will react with metal elements and/or semiconductor elements of metal-semiconductor compound films 18 as well as the unreacted metal residues 16P, thereby forming the cover layer 20. In some embodiments, the duration of the gaseous treatment is between 30 seconds and 60 seconds, but not limited thereto. In some embodiments, the gaseous treatment is implemented under low temperature and low power to alleviate adverse influence on semiconductor device. For example, the process temperature is between 100° C. and 1000° C., and the process power is between 20 W and 2000 W, but not limited thereto.

In the present embodiment, an oxygen-containing gas is introduced, and oxygen will react with nickel and polycrystalline silicon of metal-semiconductor compound films 18 to form an oxide cover layer. For example, the composition of the oxide cover layer may include silicon oxide and nickel oxide. In the present embodiment, the oxygen-containing gas may include oxygen ($O_2$), ozone ($O_3$), nitrogen oxide ($NO_x$), a combination thereof, or other oxygen-containing gases.

In some alternative exemplary embodiments, a nitrogen-containing gas is introduced, and nitrogen will react with metal element (such as nickel, platinum or other metal elements) and semiconductor element (such as silicon) of metal-semiconductor compound films 18 to form a nitride cover layer. For example, the composition of the nitride cover layer may include silicon nitride, nickel nitride, platinum nitride or other metal nitrides and semiconductor nitrides. In some embodiments, the nitrogen-containing gas may include ammonia ($NH_3$), nitrogen ($N_2$), nitrogen oxide ($NO_x$), a combination thereof, or other nitrogen-containing gases.

In still some alternative exemplary embodiments, oxygen-containing gas and nitrogen-containing gas are introduced, and oxygen and nitrogen will react with metal element (such as nickel, platinum or other metal elements) and semiconductor element (such as silicon) of metal-semiconductor compound films 18 to form an oxynitride cover layer. For example, the composition of the nitride cover layer may include silicon oxynitride, nickel oxynitride, platinum oxynitride or other metal oxynitride and semiconductor oxynitride. In some embodiments, the oxygen-containing gas may include oxygen ($O_2$), ozone ($O_3$), nitrogen oxide ($NO_x$), a combination thereof, or other oxygen-containing gases. The nitrogen-containing gas may include ammonia ($NH_3$), nitrogen ($N_2$), nitrogen oxide ($NO_x$), a combination thereof, or other nitrogen-containing gases.

In yet some alternative exemplary embodiments, a carbon-containing gas is introduced, and carbon will react with metal element (such as nickel, platinum or other metal elements) and semiconductor element (such as silicon) of metal-semiconductor compound films 18 to form a carbide cover layer. For example, the composition of the carbide cover layer may include silicon carbide, nickel carbide, platinum carbide or other metal carbides and semiconductor carbides. In some embodiments, the carbon-containing gas may include carbon oxide ($CO_x$) or other carbon-containing gases.

In some embodiments, at least one of an oxygen-containing gas, a nitrogen-containing gas or a carbon-containing gas may be introduced so as to form a cover layer formed of oxide compound, nitride compound, oxynitride compound, carbide compound, or a combination thereof.

In some embodiments, metal atoms of the semiconductor compound film 18 may diffuse into the cover layer 20 in operation 140 or successive operations, and thus the cover layer 20 may also contain Ni, Pt, Co, W, Ti or other metal atoms.

Figure 2F:
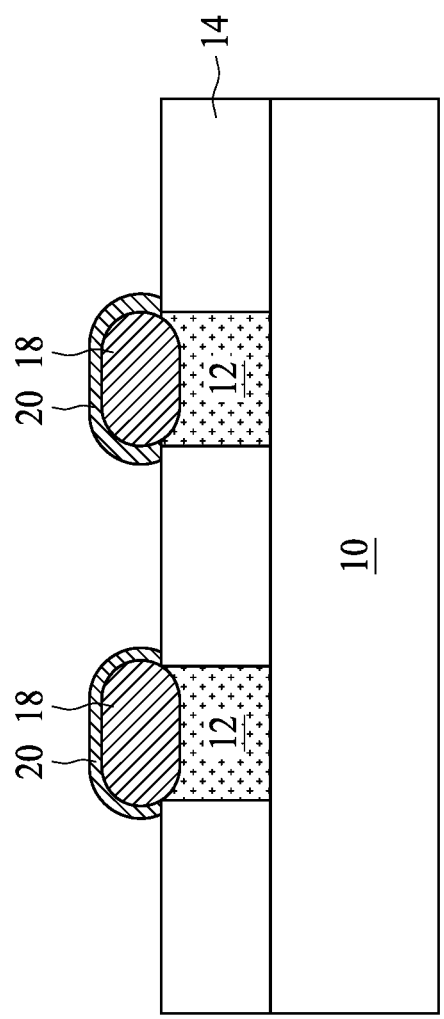

As depicted in FIG. 2F and operation 150 in FIG. 1, a second wet cleaning operation is performed to remove the unreacted metal residues 16P. In the second wet cleaning operation, the unreacted metal residues 16P enclosed by the cover layer 20 are stripped from the upper surface of the dielectric layer 14. Compared to metal residue 16P not covered with the cover layer 20, the metal residue 16P covered with the cover layer 20 is easier to be removed. In some embodiments, the removal of the unreacted metal residues 16P is a second wet clean operation subsequent to the first wet clean operation previously discussed. In addition, the cover layer 20 covering the metal-semiconductor compound films 18 is able to block metal atoms from exiting out of the metal-semiconductor compound films 18. Moreover, the metal residue 16P covered with the insulative cover layer 20 remaining on the dielectric layer 14 is less critical to the electrical characteristics compared to the conductive metal residue 16P not covered with the insulative cover layer 20.

In some embodiments, the second wet cleaning operation is performed under high temperature e.g., between 85° C. and 150° C. using sulfuric acid-hydrogen peroxide mixture (SPM) solution. SPM solution within the above temperature range is able to effectively remove metal residues, particularly platinum residues. The concentration of the cleaning solution may be modified. Different cleaning solutions may be selected based on the types of metal residues to be removed.

Figure 3:
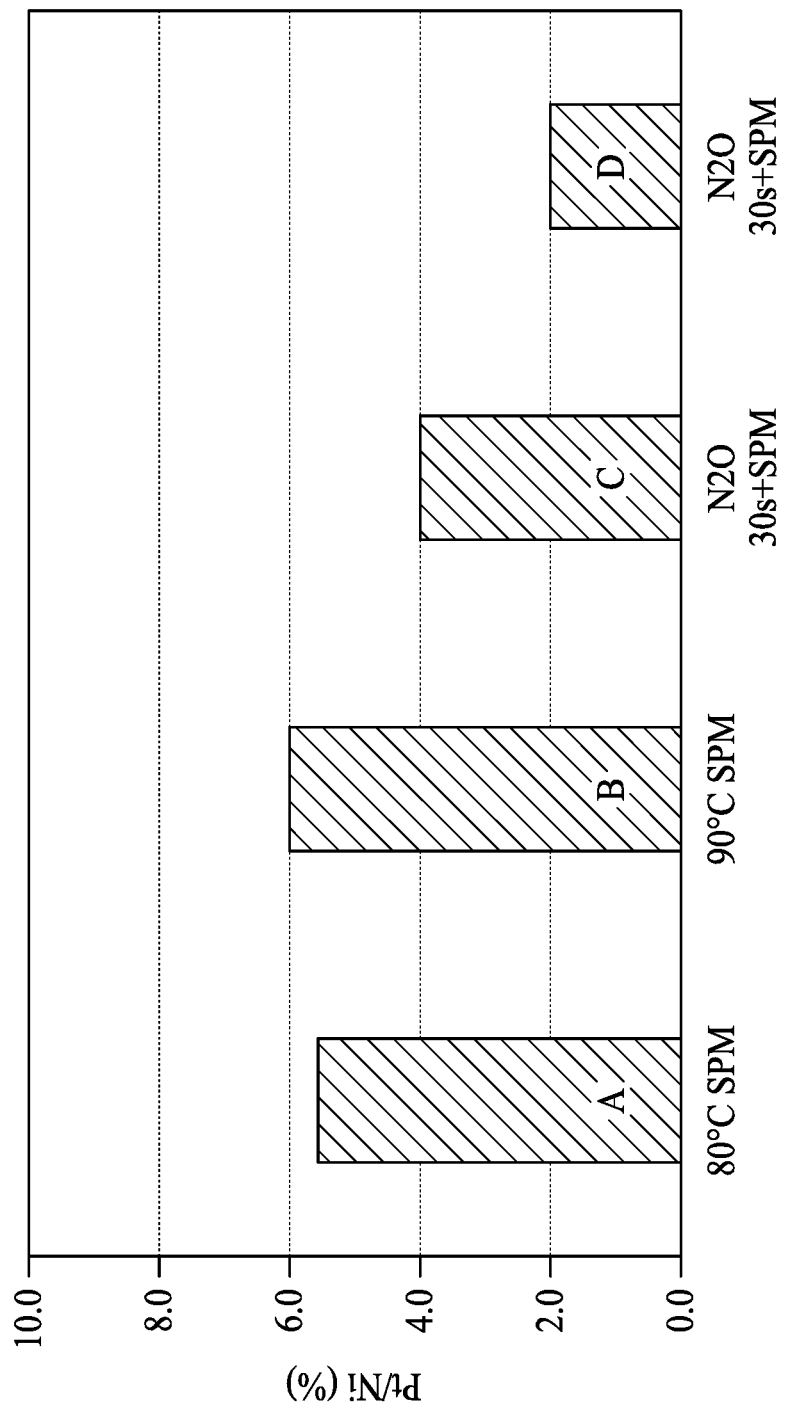
FIG. 3 is a chart illustrating an experimental result of platinum removal effect under different conditions.

FIG. 3 is a chart illustrating an experimental result of platinum removal effect under different conditions. Sample A shows that the ratio of platinum to nickel (Pt/Ni) is about 5.8% when a wet cleaning operation using SPM solution is performed under 80° C. Sample B shows that the Pt/Ni ratio is about 6% when a wet cleaning operation using SPM solution is performed under 90° C. Sample C shows that the Pt/Ni ratio is reduced to about 4% when $N_2O$ treatment is performed for about 30 seconds to form a cover layer enclosing Pt residues followed by a wet cleaning operation using SPM solution. Sample D shows that the Pt/Ni ratio is reduced to about 2% when $N_2O$ treatment is performed for about 60 seconds to form a cover layer enclosing Pt residues followed by a wet cleaning operation using SPM solution. As shown in FIG. 3, the metal residue removal effect when forming a cover layer enclosing metal residues followed by a wet cleaning operation is significantly improved.

The semiconductor device and manufacturing method of the present disclosure are not limited to the above-mentioned embodiments, and may have other different embodiments. To simplify the description and for the convenience of comparison between each of the embodiments of the present disclosure, the identical components in each of the following embodiments are marked with identical numerals.

For making it easier to compare the difference between the embodiments, the following description will detail the dissimilarities among different embodiments and the identical features will not be redundantly described.

Figure 4A:
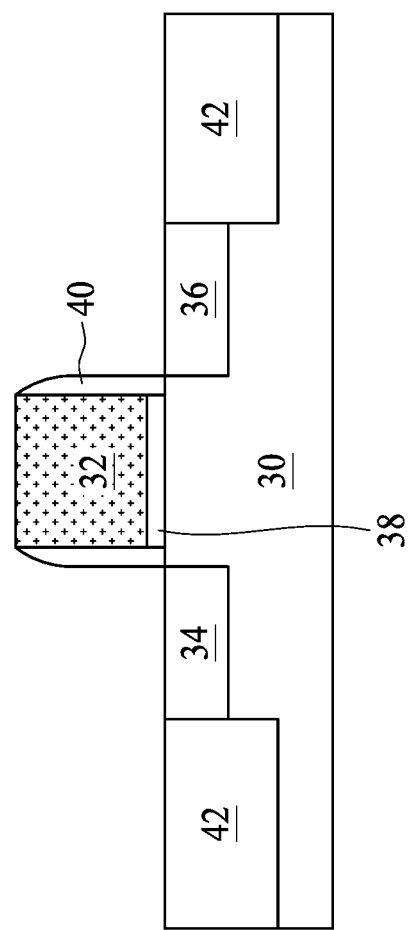

FIGS. 4A, 4B, 4C, 4D, 4E, 4F, 4G and 4H are cross-sectional views at one of various operations of manufacturing a semiconductor device according to some embodiments of the present disclosure. As depicted in FIG. 4A, a substrate 30 having a semiconductor structure formed thereon is received. A MOS (metal-oxide-semiconductor) device is formed over the substrate 30. The MOS device includes a gate electrode 32, a source region 34, a drain region 36, a gate insulator 38, gate spacers 40 and isolation structures 42. The gate electrode 32 is over the substrate 30, and the gate insulator 38 is interposed between the substrate 30 and the gate electrode 32. The gate spacers 40 are formed on the lateral sides of the gate electrode 32. The source region 34 and the drain region 36 are formed in the substrate 30 at opposite sides of the gate electrode 32. The isolation structures 42 such as shallow trench isolations (STIs) or field oxide (FOX) are formed in the substrate 30.

In the present embodiments, the semiconductor structure may refer to the gate electrode 32, the source region 34 and/or the drain region 36. In some embodiments, the material of the gate electrode 32 is doped polycrystalline silicon, and the material of the source region 34 and the drain region 36 is doped silicon, but not limited thereto.

Figure 4B:
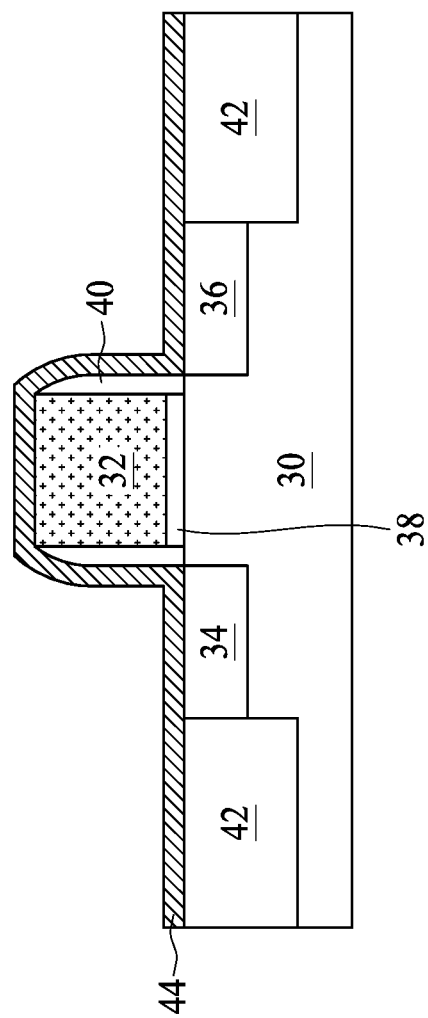

As depicted in FIG. 4B, a metal layer 44 is formed over the substrate 30 and the semiconductor structure. Specifically, a portion of the metal layer 44 is in contact with the semiconductor structure such as the gate electrode 32, the source region 34 and the drain region 36.

In some embodiments, the metal layer 44 is an alloy layer formed of a plurality of metal materials. The metal materials may include two or more transition metal materials such as nickel (Ni), platinum (Pt), cobalt (Co), tungsten (W), titanium (Ti), combinations thereof, or other suitable metal materials. In some alternative embodiments, the metal layer 44 is a metallic layer of a single metal material. The metal material may include a transition metal material such as nickel (Ni), platinum (Pt), cobalt (Co), tungsten (W), titanium (Ti), or other suitable metal materials.

In some exemplary embodiments, the metal layer 44 is a nickel-platinum alloy, or a nickel layer with platinum dopants, where the amount ratio of nickel to platinum may be adjusted based on different considerations. The material of the gate electrode 32, the source region 34 and the drain region 36 is doped silicon. In the present embodiments, nickel is configured to form nickel semiconductor compound, e.g., nickel silicide. Platinum may be configured as a stabilizer for nickel silicide. In some embodiments, nickel layer with platinum dopants is formed by physical vapor deposition (PVD) such as sputtering using nickel-platinum target. In some alternative embodiments, the metal layer 44 may be formed by other suitable deposition operations.

Figure 4C:
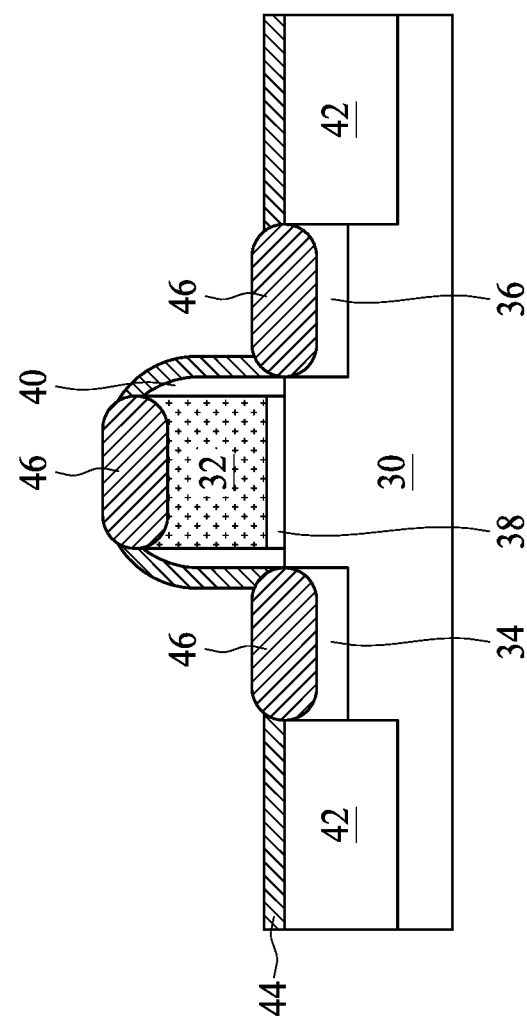

As depicted in FIG. 4C, the metal layer 44 is thermally treated to render nickel react with the gate electrode 32, the source region 34 and the drain region 36 to form metal-semiconductor compound films (nickel silicide) 46. During the thermal treatment, a portion of nickel elements in the metal layer 44 in contact with the gate electrode 32, the source region 34 and the drain region 36 are reacted, thereby selectively and locally forming nickel silicide on the upper surface of the gate electrode 32, the source region 34 and the drain region 36, respectively. On the other hands, the rest portion of the metal layer 44 that is not in contact with the gate electrode 32, the source region 34 and the drain region 36 is not reacted. In addition, some platinum elements do not react with silicon, and remain in the metal-semiconductor compound film 46.

In some embodiments, a rapid thermal annealing (RTA) may be performed to thermally treat the metal layer 44. Compared to the gate electrode 32, the source region 34 and the drain region 36 formed of silicon, the metal-semiconductor compound film (nickel silicide) 46 has lower resistivity, and thus the overall electrical characteristic is enhanced.

Figure 4D:
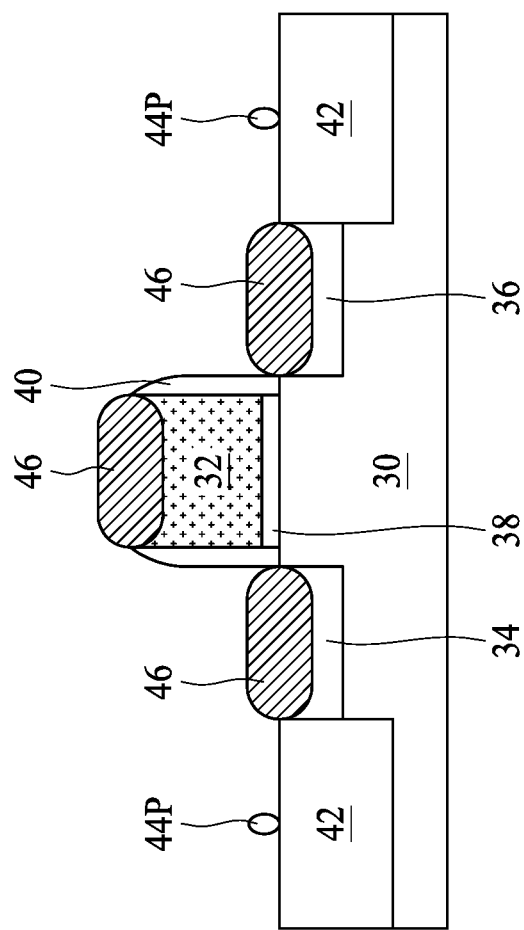

As depicted in FIG. 4D, the unreacted metal layer 44 is then removed. In some embodiments, the unreacted metal layer 44 is stripped by a cleaning solution e.g., sulfuric acid-hydrogen peroxide mixture (SPM) solution, but not limited thereto. It is appreciated that unreacted metal residues 44P including nickel residues and platinum residues may exist on the metal-semiconductor compound film 46 and the substrate 30 after the metal layer 44 is removed, which deteriorates electrical characteristics and lead to unexpected issues. For example, the unreacted metal residues 44P, particularly platinum residues, may induce worse time dependent dielectric breakdown (TDDB) and reduce breakdown voltage ($V_{BD}$).

Figure 4E:
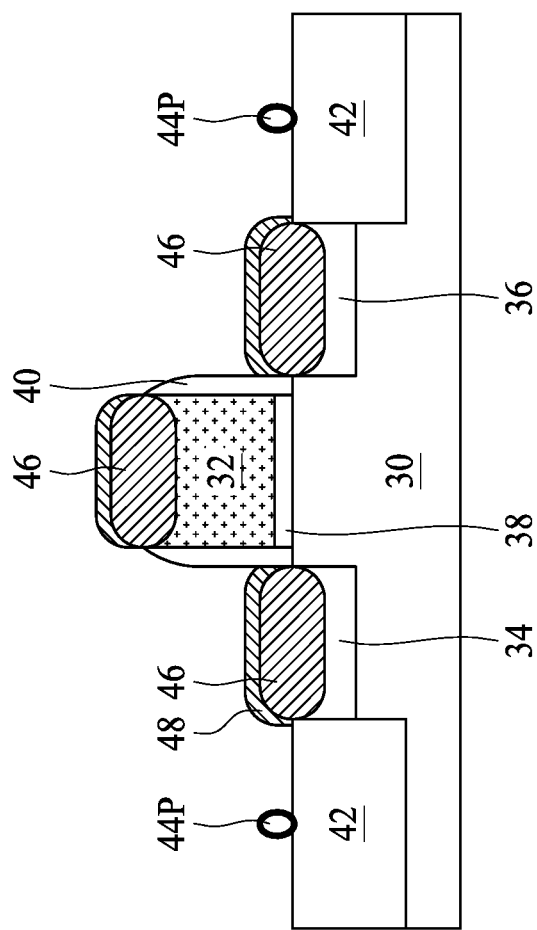

As depicted in FIG. 4E, a cover layer 48 is formed on the metal-semiconductor compound film 46. In some embodiments, the cover layer 48 encloses the unreacted metal residues 44P on the metal-semiconductor compound film 46. The cover layer 48 exposes the rest structures other than the metal-semiconductor compound films 46 such as the gate spacers 40, the isolation structures 42 and the substrate 30, and the unreacted metal residues 44P thereon. In some embodiments, the cover layer 48 is selectively and locally formed on the metal-semiconductor compound films 46, and thus the cover layer 48 is in contact with the exposed upper surface and lateral surface of the metal-semiconductor compound films 46, and encloses the unreacted metal residues 44P, but exposes the rest structures. The thickness of the cover layer 48 may be modified as to enclose the unreacted metal residue 44P.

In some embodiments, the cover layer 48 is selectively and locally formed on the metal-semiconductor compound films 46 by a gaseous treatment, which is previously described.

Figure 4F:
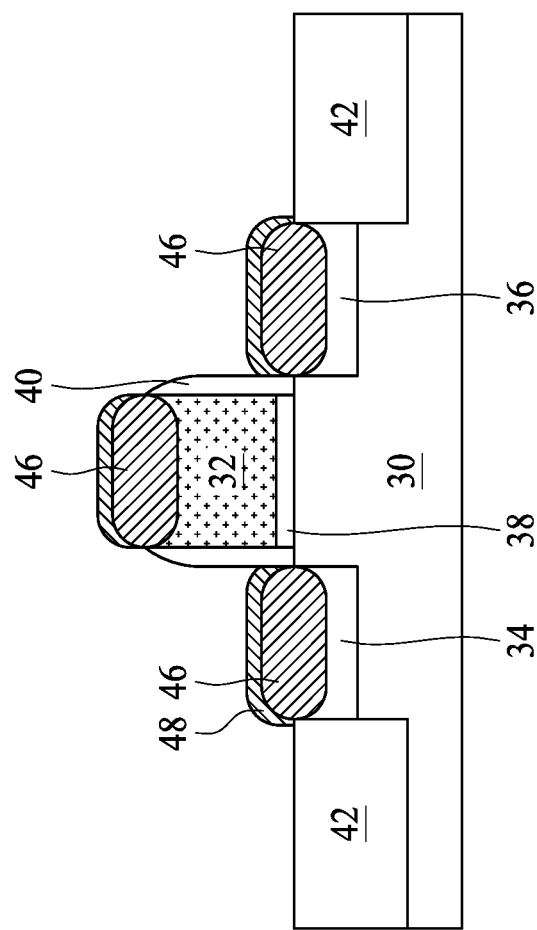

As depicted in FIG. 4F, a wet cleaning operation is performed to remove the unreacted metal residues 44P. In the wet cleaning operation, the unreacted metal residues 44P enclosed by the cover layer 48 are stripped from the upper surface of the gate spacers 40, the isolation structures 42 and the substrate 30. Compared to metal residue 44P not covered with the cover layer 48, the metal residue 44P covered with the cover layer 48 is easier to remove. In addition, the cover layer 48 covering the metal-semiconductor compound films 46 is able to block metal atoms from exiting out of the metal-semiconductor compound films 46. Moreover, the metal residue 44P covered with the insulative cover layer 48 is less critical to the aforesaid electrical characteristics compared to the conductive metal residue 44P not covered with the cover layer 48.

In some embodiments, the wet cleaning operation is performed under high temperature e.g., between 85° C. and 150° C. using sulfuric acid-hydrogen peroxide mixture (SPM) solution. SPM solution within the above temperature range is able to effectively remove metal residues, particularly platinum residues. The concentration of the cleaning solution may be modified. Different cleaning solutions may be selected based on the types of metal residues to be removed.

Figure 4G:
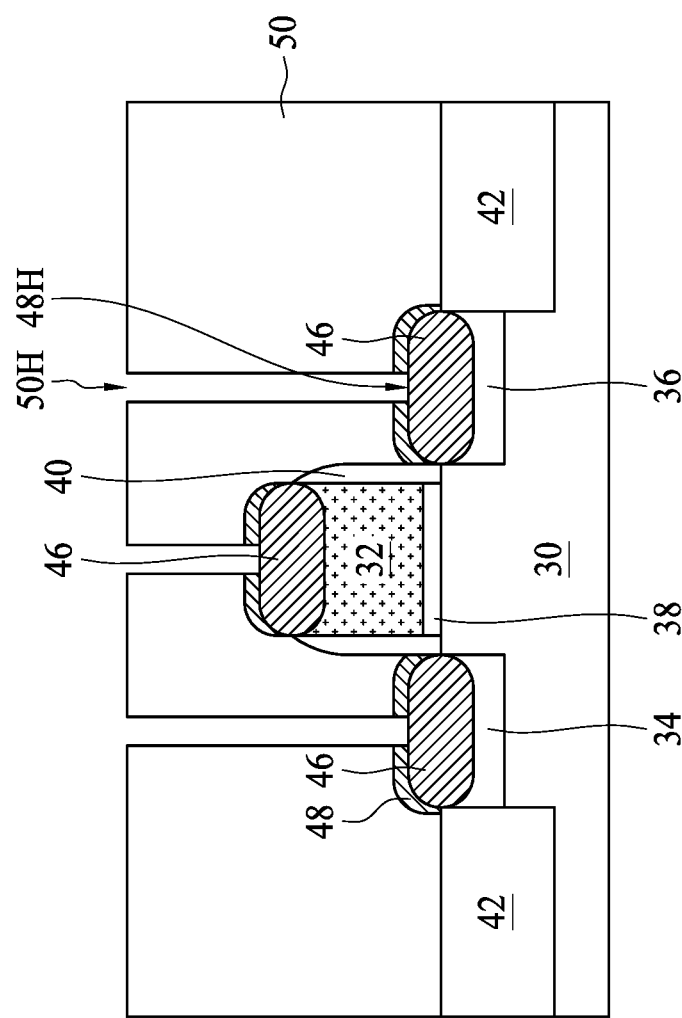

In some embodiments, an inter-layered dielectric (ILD) 50 is formed over the substrate 30, covering the MOS device as depicted in FIG. 4G. The ILD 50 may be formed of silicon oxide, silicon nitride, or any other suitable inorganic or organic dielectric materials. The ILD 50 is patterned, e.g., by photolithography and etching, to form through holes 50H partially exposing the upper surfaces of the cover layers 48. The cover layers 48 may be patterned as well via the through holes 50H to form openings 48H. The through hole 50H and the opening 48H connecting to the through hole 50H partially expose a corresponding metal-semiconductor compound film 46.

As depicted in FIG. 4H, conductive contacts 52 are formed to electrically connected to the metal-semiconductor compound films 46 respectively via the through hole 50H of the ILD 50 and the opening 48H of the cover layer 48. The material of the conductive contact 52 may include copper, aluminum or any other suitable conductive materials.

FIGS. 5A, 5B, 5C, 5D, 5E, 5F, and 5G are cross-sectional views at one of various operations of manufacturing a semiconductor device according to some embodiments of the present disclosure. In the present embodiment, an integrated circuit with a pair of embedded flash memory cell and a driving circuit is selected as an example. It will be appreciated that although these cross-sectional views illustrate only a pair of split-gate memory cells, in typical embodiments an integrated circuit will include thousands, millions, billions, or even greater numbers of such split gate memory cells arranged in a memory array. The final integrated circuit also includes peripheral circuitry that can utilize different process layers (e.g., HKMG and/or replacement metal gate technology), such as are used in CMOS processes.

Figure 5A:
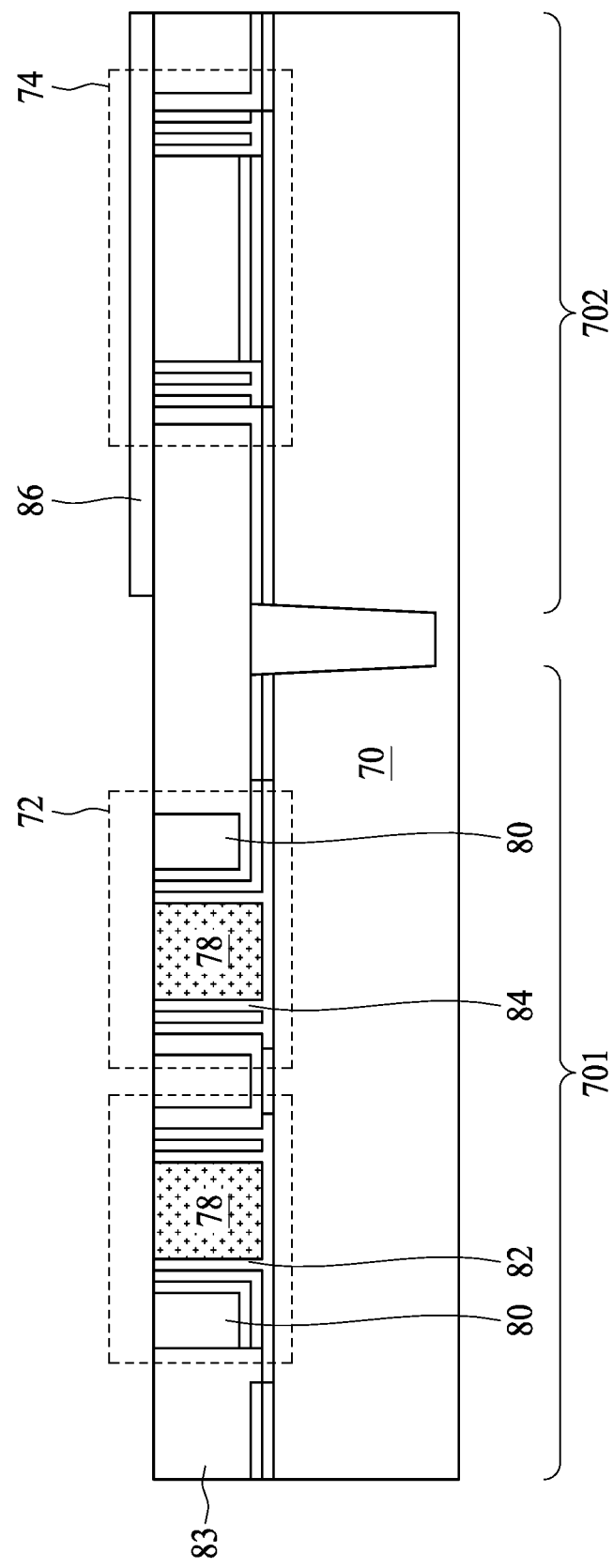
FIGS. 5A, 5B, 5C, 5D, 5E, 5F, and 5G are cross-sectional views at one of various operations of manufacturing a semiconductor device according to some embodiments of the present disclosure.

As depicted in FIG. 5A, a substrate 70 is provided. The substrate 70 has a memory region 701 and a periphery region 702. A pair of adjacent flash memory cells 72 is resided on the memory region 701 and a driving circuit 74 is resided on the periphery region 702. In some embodiments, the flash memory cell 72 is a MONOS (metal-oxide-nitride-oxide-semiconductor) cell, and the driving circuit 74 is a core circuit of SRAM. The flash memory cells 72 are located over a base dielectric layer 76. In some embodiments. In some embodiments, source/drain regions (not shown) are disposed within the substrate 70. Each flash memory cell 72 includes a select gate (SG) 78, a memory gate (MG) 80, and a charge-trapping layer 82 which extends below the MG 80. In some embodiments, the material of the SGs 78 and the MGs 80 is doped semiconductor such as polycrystalline silicon. A contact etch-stop layer (CESL) 84 resides over the substrate 70 as well as on the outer sidewalls of the SGs 78. A dielectric layer 83 is disposed over the substrate 70. The dielectric layer 83 surrounds the lateral surfaces of the SGs 78 and the MGs 80, and exposes the upper surfaces of the SGs 78 and the MGs 80. In some embodiments, the dielectric layer 83 is formed of silicon oxide, silicon nitride, or any other suitable inorganic or organic dielectric materials. Subsequently, a mask layer 86 is formed over the dielectric layer 83, and patterned to expose the flash memory cells 72. In some embodiments, the mask layer 86 includes a silicon oxide layer, but not limited thereto.

Figure 5B:
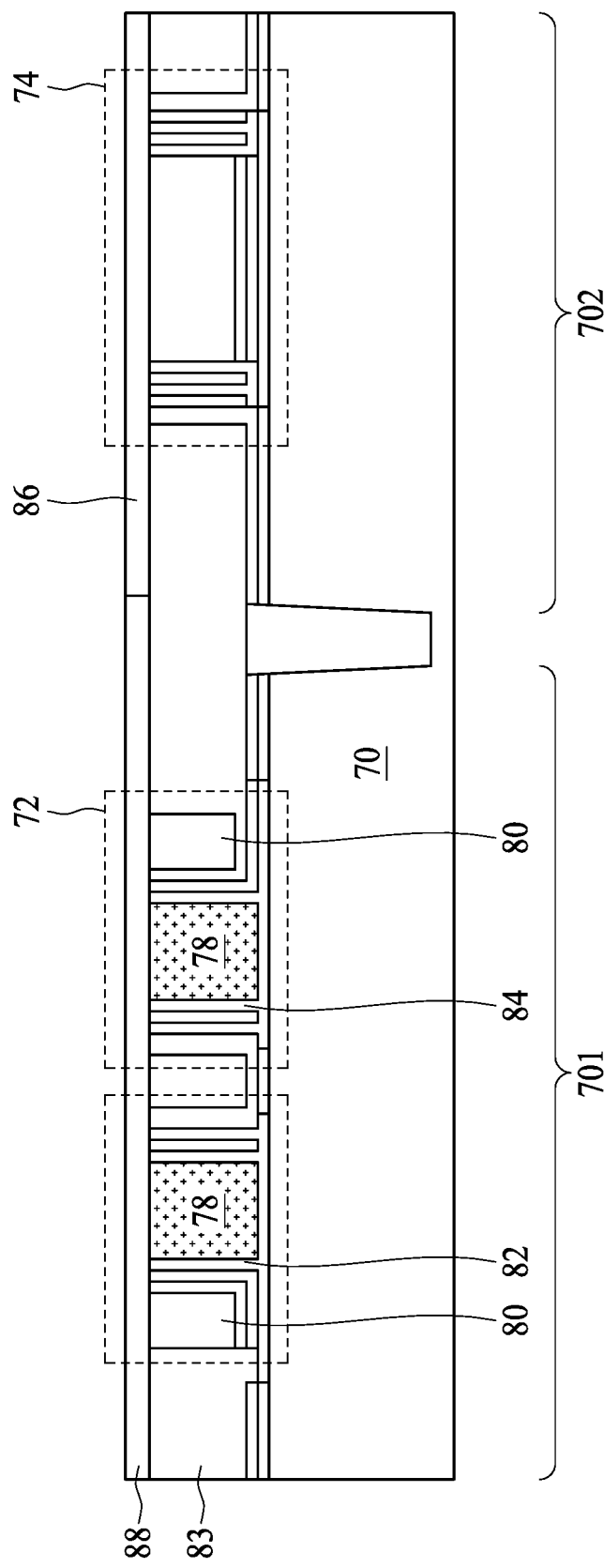

As depicted in FIG. 5B, a metal layer 88 is formed over the substrate 70, covering and in contact with the SGs 78 and the MGs 80. In some embodiments, the metal layer 88 is an alloy layer formed of a plurality of metal materials. The metal materials may include two or more transition metal materials such as nickel (Ni), platinum (Pt), cobalt (Co), tungsten (W), titanium (Ti), or other suitable metal materials. In some alternative embodiments, the metal layer 88 is a metallic layer of a single metal material. The metal material may include a transition metal material such as nickel (Ni), platinum (Pt), cobalt (Co), tungsten (W), titanium (Ti), or other suitable metal materials.

In some exemplary embodiments, the metal layer 88 is a nickel-platinum alloy, or a nickel layer with platinum dopants, where the amount ratio of nickel to platinum may be adjusted based on different considerations. In the present embodiments, nickel is configured to form nickel semiconductor compound, e.g., nickel silicide. Platinum may be configured as a stabilizer for nickel silicide. In some embodiments, nickel layer with platinum dopants is formed by physical vapor deposition (PVD) such as sputtering using nickel-platinum target. In some alternative embodiments, the metal layer 88 may be formed by other suitable deposition operations.

Figure 5C:
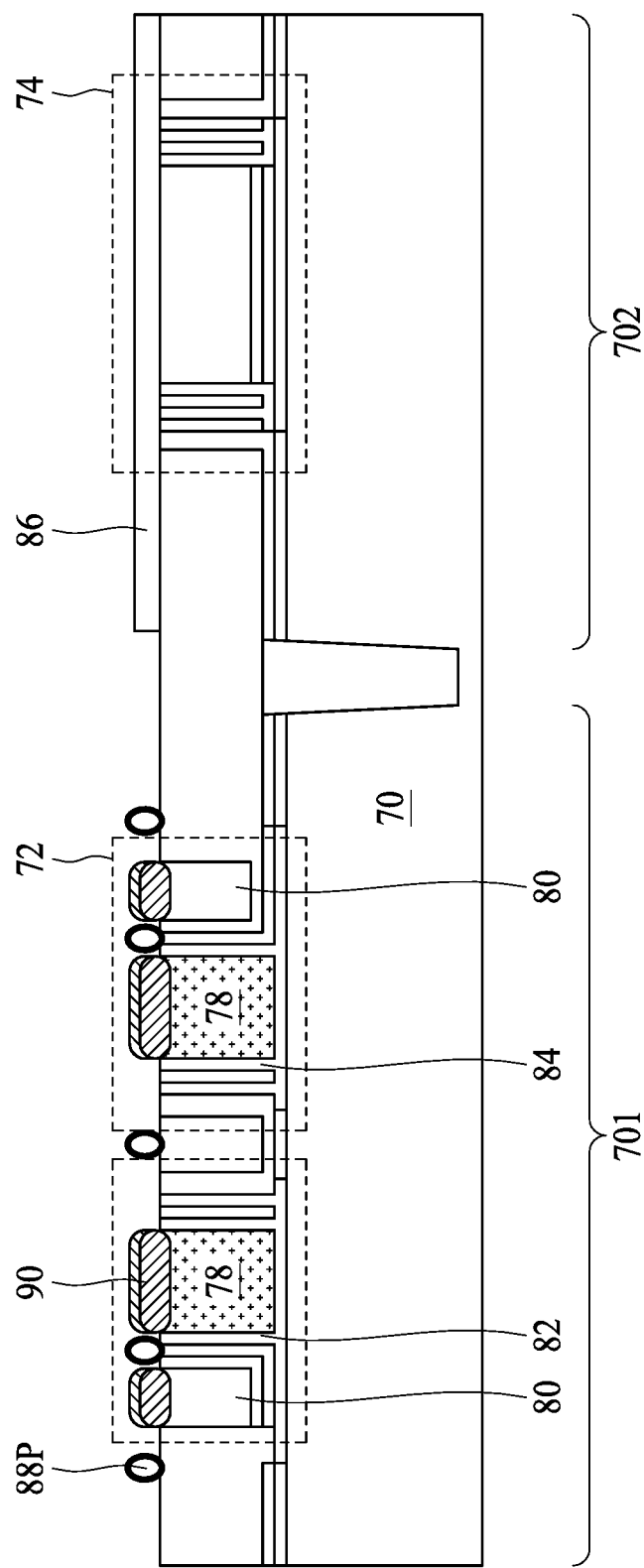

As depicted in FIG. 5C, the metal layer 88 is thermally treated to render nickel react with the SGs 78 and the MGs 80 to form metal-semiconductor compound films (nickel silicide) 90. During the thermal treatment, a portion of nickel elements in the metal layer 88 in contact with the SGs 78 and the MGs 80 are reacted, thereby selectively and locally forming nickel silicide on the upper surface of the SGs 78 and the MGs 80, respectively. On the other hands, the rest portion of the metal layer 88 that is not in contact with the SGs 78 and the MGs 80 is not reacted. In some embodiments, a rapid thermal annealing (RTA) may be performed to thermally treat the metal layer 88. Compared to the SGs 78 and the MGs 80 formed of polycrystalline silicon, the metal-semiconductor compound film (nickel silicide) 90 reduces high poly resistance by providing a better low resistance contact surface for the conductive contacts to be formed subsequently and also prevents poly damage caused during contact etching. Thus, the formation of the metal-semiconductor compound film 90 increases the program/erase speed of the flash memory device by reducing the poly resistance. During operation, the flash memory cells 72 may each be thought of as two transistors in series. Within each cell, one transistor is the memory gate transistor (e.g., corresponding to MG 80), and the other is the select gate transistor (e.g. corresponding to SG 78) which is controlled by a word line. In some embodiments, programming is performed by means of source-side channel hot-electron injection. Poly-to-poly Fowler-Nordheim (FN) electron tunneling is employed for erasing. To change the cell value to a "0", a negative electrical potential is applied to both the MG and SG transistors, such that the electrons stored in the charge-trapping layer (e.g., 82) are drained to the source side of the memory cell. The electrons in the cells of a chip can be returned to normal "1" by the application of a strong positive electric field. Because the electrons tend to remain in the charge-trapping layer even when power is disconnected from the chip, the flash memory cells are said to be "non-volatile."

The unreacted metal layer 88 is then removed. In some embodiments, the unreacted metal layer 88 is stripped by a cleaning solution e.g., sulfuric acid-hydrogen peroxide mixture (SPM) solution, but not limited thereto. It is appreciated that unreacted metal residues 88P including nickel residues and platinum residues may exist on the substrate 70 after the metal layer 88 is removed, which would deteriorate electrical characteristics and lead to unexpected issues. For example, the unreacted metal residues 88P, particularly platinum residues, may induce worse time dependent dielectric breakdown (TDDB) and reduce breakdown voltage ($V_{BD}$).

Figure 5D:
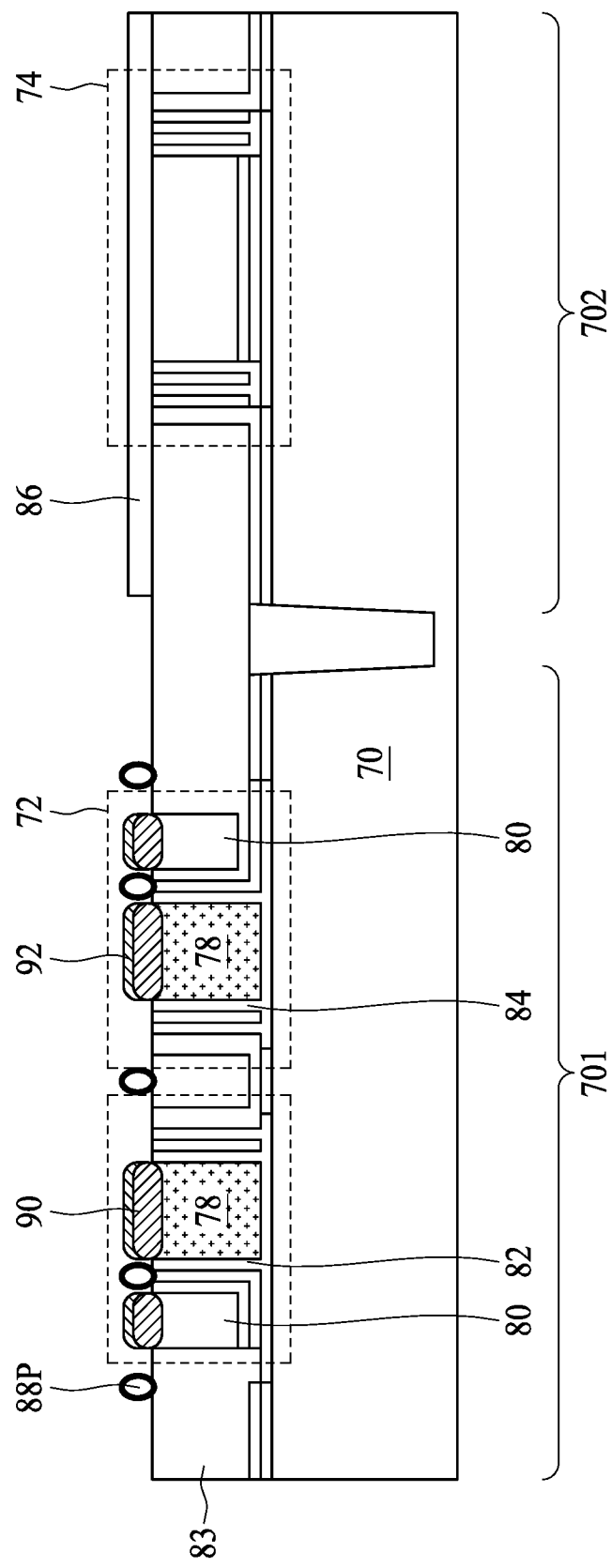

As depicted in FIG. 5D, a cover layer 92 is formed on the metal-semiconductor compound film 90. In some embodiments, the cover layer 92 encloses the metal-semiconductor compound film 90 and the unreacted metal residues 88P. The cover layer 92 exposes the rest structures other than the metal-semiconductor compound films 90 and the unreacted metal residues 88P. In some embodiments, the cover layer 92 is selectively and locally formed on the metal-semiconductor compound films 90. Specifically, the cover layer 92 is in contact with the exposed upper surface and lateral surface of the metal-semiconductor compound films 90 and encloses the unreacted metal residues 88P, but exposes the rest structures. The thickness of the cover layer 92 may be modified as to be sufficient to enclose the unreacted metal residue 88P.

In some embodiments, the cover layer 92 is selectively and locally formed on the metal-semiconductor compound films 90 by a gaseous treatment, which is previously described.

Figure 5E:
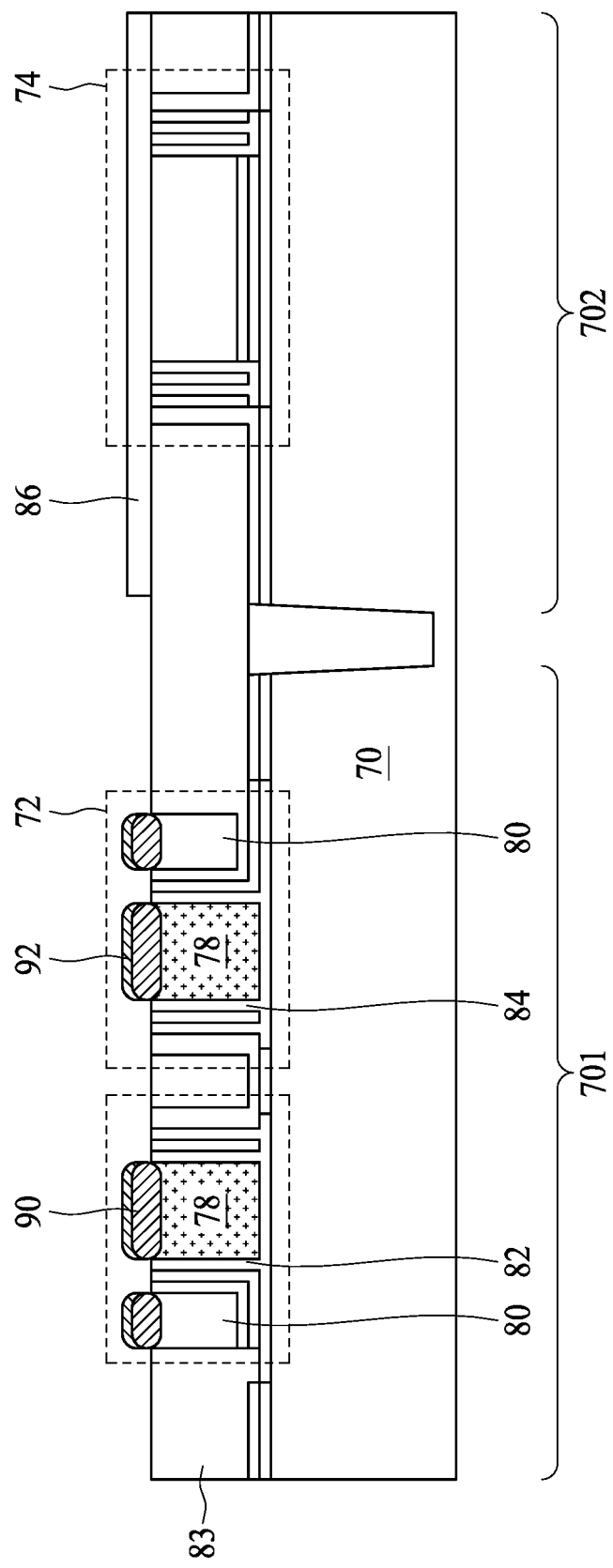

As depicted in FIG. 5E, a wet cleaning operation is performed to remove the unreacted metal residues 88P. In the wet cleaning operation, the unreacted metal residues 88P enclosed by the cover layer 92 are stripped from the upper surface of the dielectric layer 83. Compared to metal residue 88P not covered with the cover layer 92, the metal residue 88P covered with the cover layer 92 is easier to remove. In addition, the metal residue 88P covered with the insulative cover layer 92 remaining on the dielectric layer 83 is less critical to the aforesaid electrical characteristics compared to the conductive metal residue 88P not covered with the cover layer 92.

In some embodiments, the wet cleaning operation is performed under high temperature e.g., between 85° C. and 150° C. using sulfuric acid-hydrogen peroxide mixture (SPM) solution. SPM solution within the above temperature range is able to effectively remove the metal residues 88P enclosed by the cover layer 92, e.g., platinum residues enclosed by oxide cover layer. The concentration of the cleaning solution may be modified. Different cleaning solutions may be selected based on the types of metal residues to be removed.

Figure 5F:
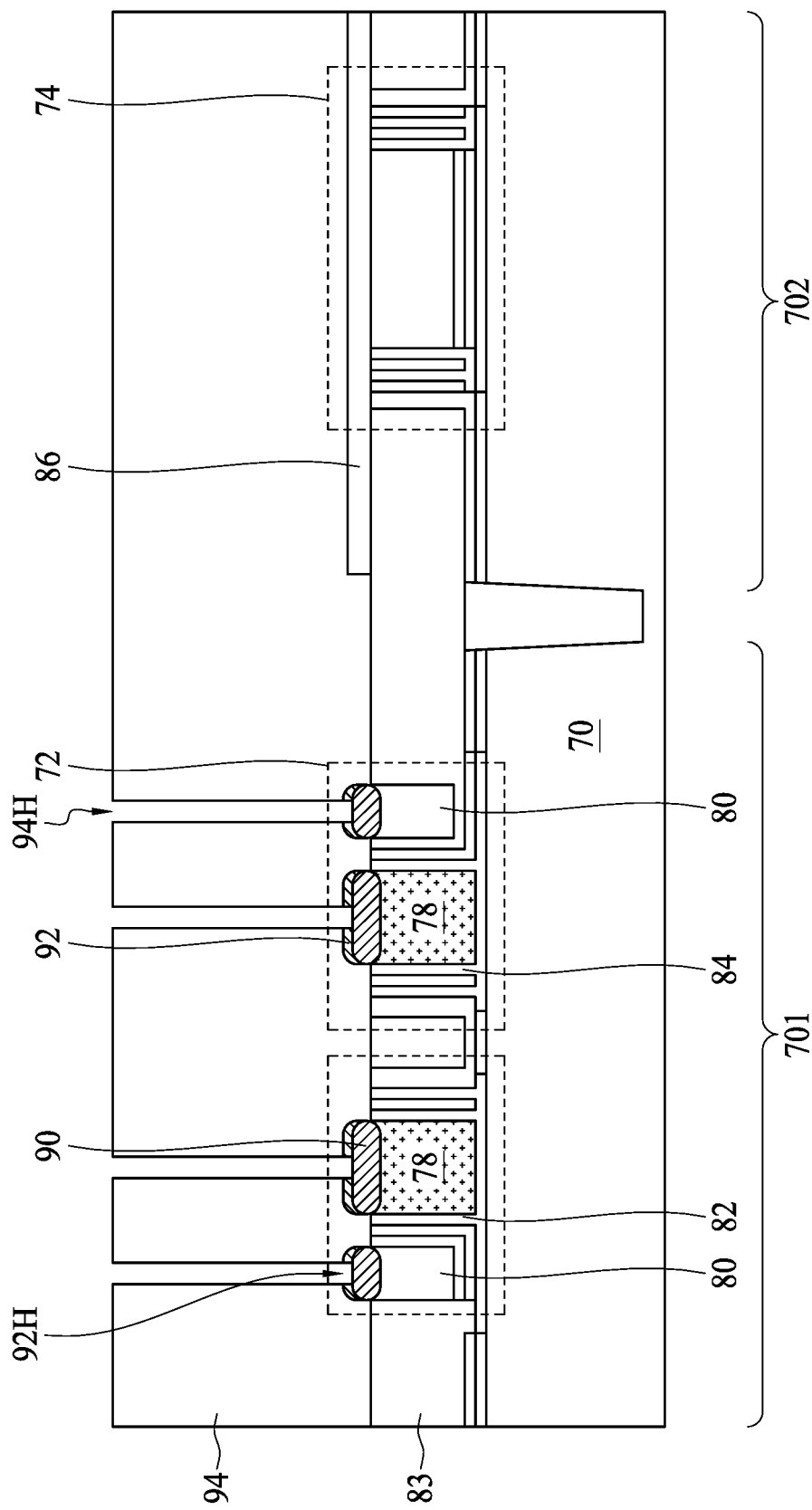

As shown in FIG. 5F, an inter-layered dielectric (ILD) 94 is formed over the substrate 70, covering the flash memory cells 72 and the driving circuit 74. The ILD 94 may be formed of silicon oxide, silicon nitride, or any other suitable inorganic or organic dielectric materials. The ILD 94 is then patterned, e.g., by photolithography and etching, to form through holes 94H partially exposing the upper surfaces of the cover layers 92. The cover layers 92 may be patterned as well via the through holes 94H to form openings 92H. The through hole 94H and the opening 92H connecting to the through hole 94H partially expose a corresponding metal-semiconductor compound film 90.

Figure 5G:
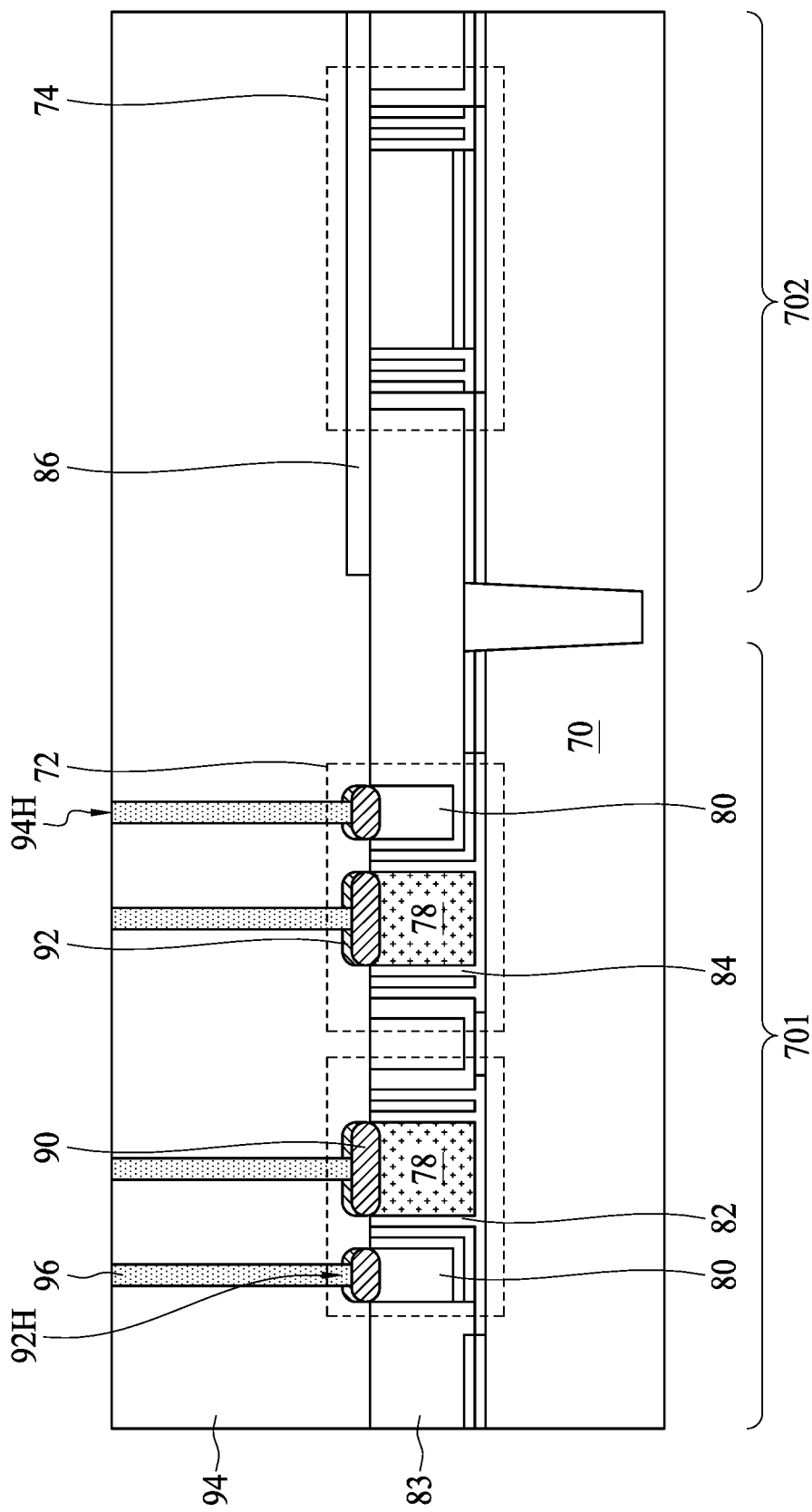

As depicted in FIG. 5G, conductive contacts 96 are formed to electrically connected to the metal-semiconductor compound films 90 respectively via the through hole 94H of the ILD 94 and the opening 92H of the cover layer 92. The material of the conductive contact 96 may include copper, aluminum or any other suitable conductive materials.

In the present disclosure, the metal-semiconductor compound film atop the semiconductor structure is partially covered with a cover layer. The cover layer is configured to enclose unreacted metal residues, thereby making it easier to remove the metal residues with a wet cleaning treatment. Accordingly, various electrical issues such as reduction of time dependent dielectric breakdown (TDDB) and breakdown voltage ($V_{BD}$) are significantly alleviated.

In one exemplary aspect, a semiconductor device is provided. The semiconductor device comprises a semiconductor structure, a dielectric layer, a metal-semiconductor compound film, and a cover layer. The semiconductor structure has an upper surface and a lateral surface. The dielectric layer encloses the lateral surface of the semiconductor structure and exposes the upper surface of the semiconductor structure. The metal-semiconductor compound film is on the semiconductor structure, wherein the dielectric layer exposes a portion of a surface of the metal-semiconductor compound film. The cover layer encloses the portion of the surface of the metal-semiconductor compound film exposed by the dielectric layer, and exposes the dielectric layer.

In another exemplary aspect, a semiconductor device is provided. The semiconductor device comprises a semiconductor substrate, a gate electrode, a metal-semiconductor compound film, a dielectric layer, a cover layer, an inter-layered dielectric (ILD), and a conductive contact. The metal-semiconductor compound film is on the gate electrode. The dielectric layer encloses the gate electrode and exposes a portion of a surface of the metal-semiconductor compound film. The cover layer is on the portion of the surface of the metal-semiconductor compound film, and exposes an upper surface of the dielectric layer. The cover layer has an opening partially exposing the portion of the surface of the metal-semiconductor compound film. The ILD is over the dielectric layer, wherein the ILD has a through hole connecting the opening of the cover layer. The conductive contact is electrically connected to the metal-semiconductor compound film via the through hole of the ILD and the opening of the cover layer.

In yet another aspect, a method for fabricating semiconductor device is provided. The method includes the following operations. A substrate having a semiconductor structure formed thereon is received. A metal layer is formed over the substrate and the semiconductor structure. The metal layer is thermally treated to render the metal layer react with the semiconductor structure to form a metal-semiconductor compound film on the semiconductor structure. A cover layer covering the metal-semiconductor compound film and exposing the substrate is formed, wherein the cover layer encloses unreacted metal residues. A wet cleaning operation is performed to remove the unreacted metal residues.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
 a metal-semiconductor compound film over a semiconductor substrate, wherein the metal-semiconductor compound film comprising a semiconductor and a first metal; and
 a cover layer enclosing a first portion of a surface of the metal-semiconductor compound film, wherein the cover layer comprises at least one of an oxide of the first metal, a nitride of the first metal, an oxynitride of the first metal, or a carbide of the first metal.

2. The semiconductor device of claim 1, wherein the metal-semiconductor compound film is part of a source/drain feature.

3. The semiconductor device of claim 1, wherein the metal-semiconductor compound film comprises nickel platinum silicide, the first metal being nickel.

4. The semiconductor device of claim 1, wherein a material of the cover layer comprises the oxide of the first metal and an oxide of the semiconductor.

5. The semiconductor device of claim 1, wherein a material of the cover layer comprises the nitride of the first metal and a nitride of the semiconductor.

6. The semiconductor device of claim 1, wherein a material of the cover layer comprises the oxynitride of the first metal and an oxynitride of the semiconductor.

7. The semiconductor device of claim 1, wherein a material of the cover layer comprises the carbide of the first metal and a carbide of the semiconductor.

8. The semiconductor device of claim 1, wherein the metal-semiconductor compound film is formed on a gate electrode.

9. The semiconductor device of claim 7, further comprising:
an inter-layered dielectric (ILD) over the cover layer; and
a conductive contact extending to interface the metal-semiconductor compound film, wherein the conductive contact extends through the ILD and through an opening of the cover layer.

10. A semiconductor device, comprising:
transistor elements formed over a semiconductor substrate, wherein the transistor elements each include a gate, a source and a drain;
a metal-semiconductor compound film on at least one of the gate, the source or the drain, the metal-semiconductor compound film including a first metal and silicon;
a cover layer interfacing the metal-semiconductor compound film, wherein the cover layer has an opening partially extending to a surface of the metal-semiconductor compound film, and wherein the cover layer includes the first metal, silicon, and at least one of nitrogen, oxygen or carbon;
a conductive contact extending to the metal-semiconductor compound film within the opening of the cover layer.

11. The semiconductor device of claim 10, wherein the conductive contact within the opening of the cover layer interfaces sidewalls of the cover layer.

12. The semiconductor device of claim 10, wherein the metal-semiconductor compound film comprises the first metal, a second metal and silicon.

13. The semiconductor device of claim 12, wherein the first metal comprises nickel, the second metal comprises platinum.

14. The semiconductor device of claim 10, wherein a material of the cover layer comprises metal oxide, metal nitride, metal oxynitride, metal carbide or a combination thereof having the first metal.

15. A semiconductor device, comprising:
a semiconductor substrate having a memory region and a peripheral region;
a plurality of gate electrodes in the memory region and over the semiconductor substrate;
a plurality of metal-semiconductor compound films on the plurality of gate electrodes, respectively;
a plurality of cover layers including a respective cover layer on at least a portion of a surface of each of the metal-semiconductor compound films, wherein the plurality of cover layers includes at least one of a metal oxide, a metal nitride, a metal oxynitride, or a metal carbide.

16. The semiconductor device of claim 15, further comprising:
an inter-layered dielectric (ILD) over the plurality of gate electrodes; and
a plurality of conductive contacts extending through the ILD and the plurality of cover layers and to interface the plurality of metal-semiconductor compound films.

17. The semiconductor device of claim 15, a dielectric layer interfacing each of the plurality of cover layers at a first portion of a surface of each of the plurality of cover layers, wherein a respective conductor contact of a plurality of conductive contacts interfaces respective cover layer of the plurality of cover layers at a second portion of the surface.

18. The semiconductor device of claim 15, wherein a respective cover layer of the plurality of cover layers further includes silicon.

19. The semiconductor device of claim 15, wherein a respective metal-semiconductor compound film of the plurality of the metal-semiconductor compound films comprises a first metal, a second metal and a semiconductor material and wherein the plurality of cover layers include at least one of the metal oxide, the metal nitride, the metal oxynitride, and the metal carbide having the first metal.

20. The semiconductor device of claim 19, wherein the first metal comprises nickel, the second metal comprises platinum, and the semiconductor material comprises silicon and wherein the plurality of cover layers further include at least one of silicon oxide, silicon nitride, silicon oxynitride, and silicon carbide.

* * * * *